(12) United States Patent
Lee

(10) Patent No.: US 8,967,425 B2
(45) Date of Patent: Mar. 3, 2015

(54) COVER APPARATUS FOR ELECTRONIC DEVICE

(71) Applicant: Samsung Electronics Co. Ltd., Suwon-si, Gyeonggi-do (KR)

(72) Inventor: Wan-Hyoung Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/867,657

(22) Filed: Apr. 22, 2013

(65) Prior Publication Data

US 2014/0061216 A1    Mar. 6, 2014

(30) Foreign Application Priority Data

Aug. 30, 2012   (KR) .................. 10-2012-0095580

(51) Int. Cl.
- *B65D 43/16* (2006.01)
- *B65D 43/24* (2006.01)
- *H05K 5/02* (2006.01)
- *B65D 43/22* (2006.01)

(52) U.S. Cl.
CPC .................................. *H05K 5/0226* (2013.01)
USPC ............ 220/848; 220/830; 220/831; 220/844

(58) Field of Classification Search
USPC .................. 220/848, 4.22, 830, 831, 844
See application file for complete search history.

(56) References Cited

U.S. PATENT DOCUMENTS

| | | | | |
|---|---|---|---|---|
| 1,918,664 A | * | 7/1933 | Rasmusson | 220/326 |
| 2,557,048 A | * | 6/1951 | Haase | 220/830 |
| 4,458,379 A | * | 7/1984 | Shelton | 16/297 |
| 6,033,015 A | * | 3/2000 | Husted | 297/188.19 |
| 6,588,624 B1 | * | 7/2003 | Connors et al. | 220/827 |
| 7,753,227 B2 | * | 7/2010 | Guo | 220/830 |
| 7,753,228 B2 | * | 7/2010 | Yuhara | 220/835 |
| 2004/0011804 A1 | * | 1/2004 | Yanagihara | 220/830 |
| 2007/0205208 A1 | * | 9/2007 | Ueda | 220/813 |
| 2008/0078776 A1 | * | 4/2008 | Guo | 220/830 |
| 2008/0087678 A1 | * | 4/2008 | Ishii et al. | 220/830 |
| 2010/0124953 A1 | | 5/2010 | Yang et al. | |

FOREIGN PATENT DOCUMENTS

KR    10-1048181 B1    7/2011

* cited by examiner

*Primary Examiner* — Mickey Yu
*Assistant Examiner* — Niki Eloshway
(74) *Attorney, Agent, or Firm* — Jefferson IP Law, LLP

(57) ABSTRACT

A cover apparatus for an electronic device is provided. The cover apparatus includes a cover configured to be pivotably coupled to a body of the electronic device to open or close a portion of the body, and an elastic member, one end of which is supported by the cover, and the other end of which is supported by the body. The elastic member provides a driving force to pivot the cover in a direction for opening the portion of the body, and the cover includes a seating portion configured to fix the one end of the elastic member.

8 Claims, 6 Drawing Sheets

COVER APPARATUS FOR ELECTRONIC DEVICE

PRIORITY

This application claims the benefit under 35 U.S.C. §119(a) of a Korean patent application filed on Aug. 30, 2012 in the Korean Intellectual Property Office and assigned Serial No. 10-2012-0095580, the entire disclosure of which is hereby incorporated by reference.

BACKGROUND OF THE INVENTION

1. Field of the Invention

The present invention relates to various electronic devices, such as a mobile communication terminal, a digital camera, a portable multimedia reproducing device, and a portable game machine. More particularly, the present invention relates to a cover apparatus for opening or closing a portion of a body of an electronic device.

2. Description of the Related Art

An electronic device, such as a mobile communication terminal, a digital camera, a portable multimedia reproducing device, and the like, is able to be carried by a user includes a battery pack. With advances in technology, some of these electronic devices are provided with other functions in addition to their intrinsic functions and may be provided with an expanded file storage capacity by inserting or mounting an expansion pack or a storage medium.

The battery pack may be provided in an electronic device by being embedded therein. However, there is a problem in that if the capacity and thus the size of the battery pack is increased, the portability of the electronic device is deteriorated. Therefore, to secure the portability of the electronic device, the capacity of the battery pack may be reduced. In that case, the limited capacity of the battery pack may be supplemented by providing a battery pack mounting part opening/closing structure, and an extra battery pack. In order to ease the replacement of the battery pack, and to fix and protect the mounted battery pack, an additional cover is required.

In general, a slot provided in an expansion pack, a mobile communication terminal, a portable terminal or the like to insert and mount a storage medium is usually exposed to the outside. When such a slot is exposed to the external environment for a long period, pollution by foreign matter or the like is unavoidable. Thus, a cover is provided to close such a slot of an electronic device in a state in which an expansion pack or a storage medium is not inserted.

A cover apparatus is disclosed in Korean patent publication No. 10-1048181 (registered on Jul. 4, 2011). In the cover apparatus disclosed in the referenced publication, a shaft of a hinge is used to pivotably couple a cover to a case, and the cover is adapted to be pivoted by the torsion of a torsion spring. Such a cover apparatus is usually provided with a locking device in order to maintain the cover in a state in which the cover is in close contact with the case.

However, the cover apparatus of the related art provided in an electronic device causes many difficulties during assembly. Specifically, in order to assemble the shaft, the aligned state of the case, the cover and the torsion spring should be maintained. However, it is not easy to assemble the shaft while maintaining the aligned state of the three elements. Accordingly, a separate jig is used in order to assemble such a cover apparatus. In addition, since the position of the torsion spring is not constantly maintained after the torsion spring is assembled, there is high probability of causing deviations among individual products. Due to these assembling deviations, the cover's pivoting angle ranges or stopping positions differ from product to product, which makes it difficult to secure a consistent quality for products.

Therefore, there is a need for an improved cover apparatus for an electronic device to avoid assembly deviations and to ease assembly.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a cover apparatus for an electronic device having a construction that can be easily assembled even if a separate jig is not used.

Another aspect of the present invention is to provide a cover apparatus for an electronic device in which the assembling positions between individual constitutional elements are capable of being constantly maintained, thereby suppressing assembling deviations among individual products.

Another aspect of the present invention is to provide a cover apparatus for an electronic device that can suppress assembling deviations among individual products, thereby enabling a consistent quality to be secured for the products.

In accordance with an aspect of the present invention, a cover apparatus for an electronic device is provided. The apparatus includes a cover configured to be pivotably coupled to a body of the electronic device to open or close a portion of the body, and an elastic member, one end of which is supported by the cover, and the other end of which is supported by the body. The elastic member provides a driving force to pivot the cover in a direction for opening the portion of the body, and the cover includes a seating portion configured to fix the one end of the elastic member.

The cover apparatus configured as described above has an advantage in that because the elastic member can be installed in a state in which it is aligned at a predetermined position only with the assembling construction of the cover and the elastic member without using a separate jig, the cover apparatus can be easily assembled. Accordingly, an assembling deviation can be suppressed among individual products by constantly maintaining the assembling positions of individual constitutional elements, and the pivot angle range or stopping position of the cover of each of the products can be more consistently maintained. That is, there is an advantage in that an assembling deviation among individual products can be suppressed, and the consistency in assembling quality and operating quality can be maintained.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
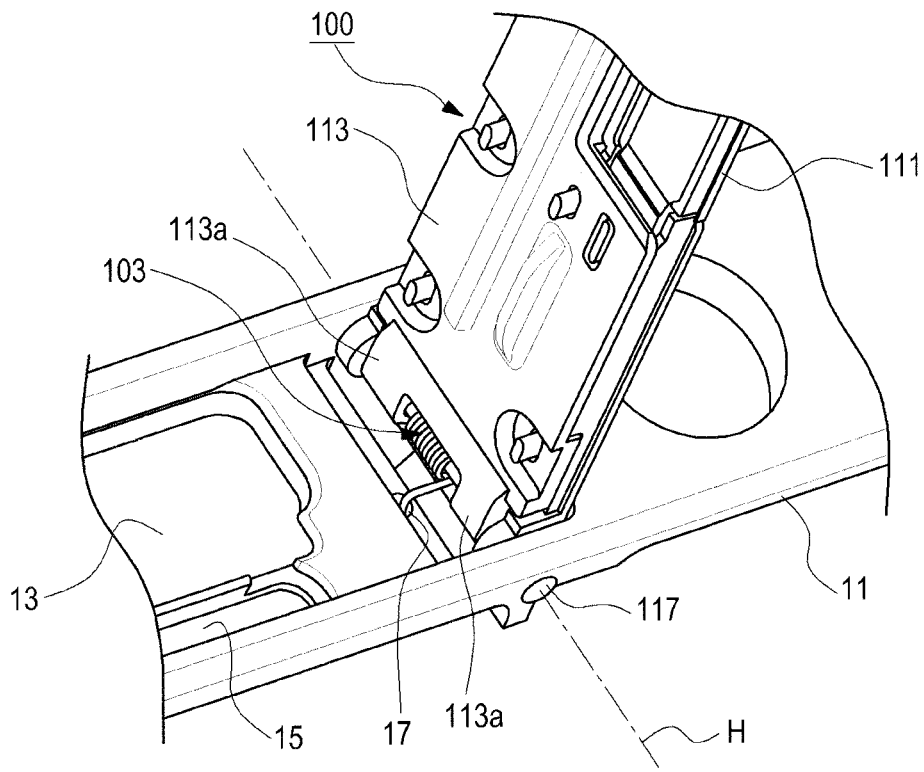
FIG. 1 is a perspective view illustrating a cover apparatus for an electronic device according to an exemplary embodiment of the present invention which is installed in an electronic device.
Figure 2:
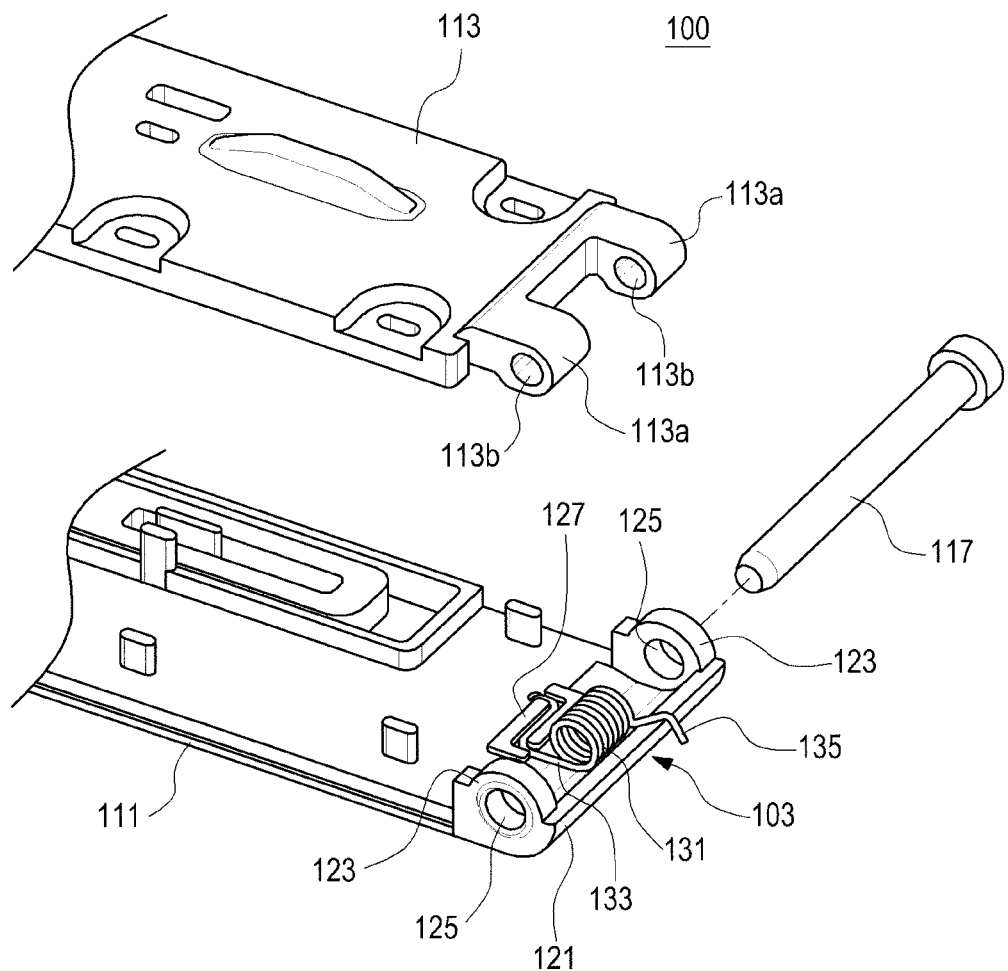
FIG. 2 is an exploded perspective view illustrating the cover apparatus depicted in FIG. 1 according to an exemplary embodiment of the present invention.
Figure 3:
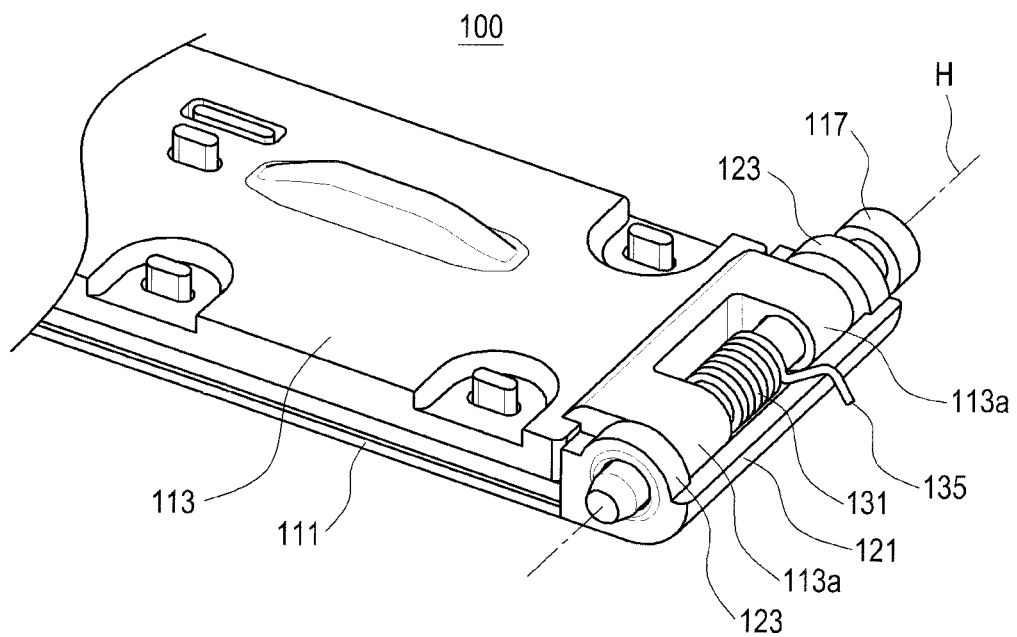
FIG. 3 is a perspective view illustrating the cover apparatus depicted in FIG. 1 in the assembled state according to an exemplary embodiment of the present invention.

FIG. 1 is a perspective view illustrating a cover apparatus for an electronic device according to an exemplary embodiment of the present invention which is installed in an electronic device. FIG. 2 is an exploded perspective view illustrating the cover apparatus depicted in FIG. 1 according to an exemplary embodiment of the present invention. FIG. 3 is a perspective view illustrating the cover apparatus depicted in FIG. 1 in the assembled state according to an exemplary embodiment of the present invention.

Referring to FIGS. 1 to 3, a cover apparatus 100 includes a cover 111 pivotably coupled to a body 11 of an electronic device, and an elastic member 103. The elastic member 103 is configured to provide a driving force for pivoting the cover 111 in a direction for opening a portion of the body 11 of the electronic device. The cover 111 includes a seating portion 127 capable of fixing and supporting an end of the elastic member 103. By providing the seating portion 127 for fixing an end of the elastic member 103, the elastic member 103 is fixedly maintained at a predetermined position in the process of assembly.

Prior to discussing the construction of the cover apparatus 100, the construction of the electronic device will be generally discussed. FIG. 1 exemplifies any type of electronic device such as a digital camera, a portable multimedia reproducing device, and the like and only a portion of the body 11 is illustrated in FIG. 1. The body 11 is provided with slots 13 and 15 for accommodating a storage medium, such as a memory card, and a battery pack, respectively. Each of the inlets of the slots 13 and 15 is provided on the outer peripheral surface of the body 11. The cover 111 opens or closes a portion of an outer peripheral surface of the body 11, in which the inlets of the slots 13 and 15 are positioned in the area opened or closed by the cover 111. Although not illustrated in the drawings, an image/sound output terminal, a power terminal, a universal serial bus terminal or the like may be positioned in the area opened and closed by the cover 111, beyond the slots 13, 15 for the storage medium and the battery pack.

Figure 4:
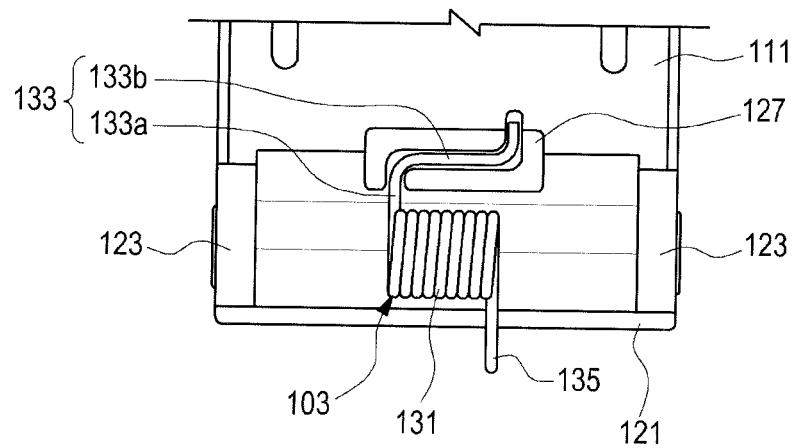
FIG. 4 is a top plan view illustrating an elastic member arranged in the cover apparatus depicted in FIG. 1 according to an exemplary embodiment of the present invention.
Figure 6:
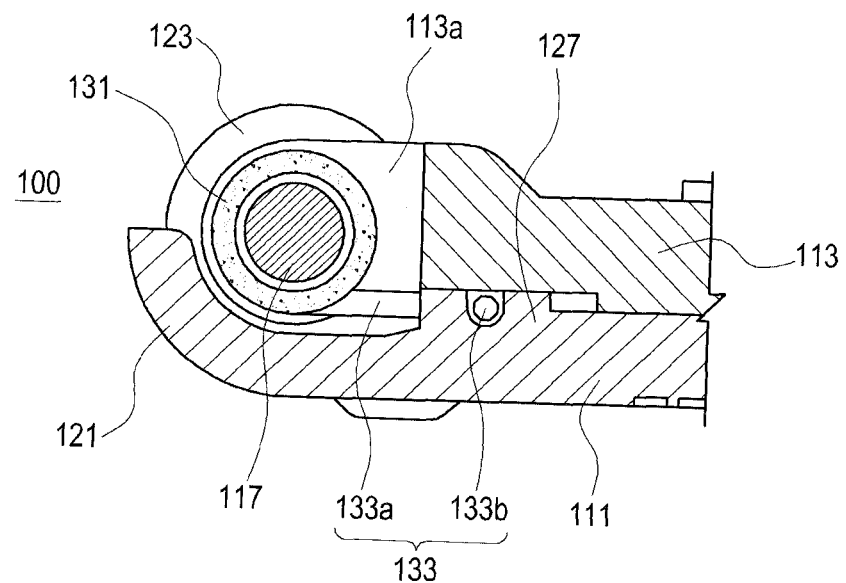
FIG. 6 is a cross-sectional view illustrating the cover apparatus taken along line A-A' in FIG. 5 according to an exemplary embodiment of the present invention.

The cover 111 is pivotably coupled to the body 11 at an end thereof, in which a round portion 121 is formed at the end of the cover 111. The round portion 121 provides a rounded inside surface. At the opposite ends of the round portion 121, support ribs 123 are formed to be opposed to each other. The support ribs 123 have a substantially circular shape, and each of the support ribs 123 is formed with a first pivot hole 125. The first pivot holes 125 are aligned on a straight line, specifically on a hinge axis H to be described in more detail below. The seating portion 127 is formed on the inner surface adjacent to the round portion 121, and includes a groove for receiving and fixing an end of the elastic member 103. FIGS. 2, 4 and 6 illustrate a construction in which an end of the elastic member 103 is received in the groove provided in the seating portion 127.

The cover apparatus 100 may further include an auxiliary cover 113 coupled to the inner surface of the cover 111. The auxiliary cover 113 is configured to conceal the structures formed on the inner surface of the cover 111. If the auxiliary cover 113 is formed of an elastic material and has a protrusion, the auxiliary cover 113 may compress the battery pack or the like inserted into the slots 13 and 15 to allow the battery pack or the like to maintain a stable connection condition. In addition, in the state in which the auxiliary cover 113 is coupled to the cover 111, the auxiliary cover 113 conceals the seating portion 127, and at least a portion of the auxiliary cover 113 is closely contacted with the surface of the seating portion 127. Accordingly, the end of the elastic member 103 is restrained to the seating portion 127 by the auxiliary cover 113. Of course, even if the auxiliary cover 113 is not coupled to the inner surface of the cover 111, the end of the elastic member 103 may be prevented from breaking out from the seating portion 127. For example, the end of the elastic member 103 may be fixed by adhering the end of the elastic member 103 to the seating portion 127, or welding a portion of the seating portion 127 or attaching a separate fixing piece to the seating portion 127 in a state in which the elastic member 103 is positioned in the seating portion 127. However, by providing the auxiliary cover 113, it will be easy for the cover 111 to implement a construction for compressing the battery pack or the like inserted into the slots 13 and 15.

The auxiliary cover 113 may include support pieces 113a formed at an end thereof. The support pieces 113a extend in parallel to each other in a state in which they are spaced from each other on the end of the auxiliary cover 113, and each of the support pieces 113a has a second pivot hole 113b. When the auxiliary cover 113 is coupled to the cover 111, the support pieces 113a are positioned in the round portion 121, and aligned on the hinge axis H. That is, when the auxiliary cover 113 is coupled to the cover 111, the second pivot holes 113b are aligned on the straight line with the first pivot holes 125.

One end of the elastic member 103 is supported by the cover 111, and the other end is supported by the body 11 in such a manner that the elastic member 103 provides a driving force for pivoting the cover 111 in a direction to open a portion of the body 11. The elastic member 103 includes an elastic part 131 that is wound in a coil shape, and free ends that extend from the elastic part 131, respectively, in which the one end of the elastic member 103 supported by the cover 103 is one of the free ends. Hereinbelow, one of the free ends of the elastic member 103 supported by the cover 111 will be referred to as a "first free end 133", and the remaining free end will be referred to as a "second free end 135." The first and second free ends 133 and 135 extend from the opposite ends of the elastic part 131, respectively, and maintain an angle of about 150 degrees in relation to each other when no external force is applied thereto.

As illustrated in FIG. 1, the second free end 135 is fixed as its end is engaged in a bind hole 17 formed in the body 11. The second free end 135 has a shape formed by bending its end in a predetermined direction such that it can be maintained in the state where it is engaged in the bind hole 17.

FIG. 4 is a top plan view illustrating an elastic member arranged in the cover apparatus depicted in FIG. 1 according to an exemplary embodiment of the present invention.

Referring to FIG. 4, the first free end 133 is configured to be fixed to the seating portion 127, and may be divided into an elastic support part 133a extending from the one end of the elastic part 131 in a direction inclined in relation to the hinge axis H, preferably in a direction perpendicular to the hinge axis H by a predetermined length, and a fixed support part 133b bent at and extending from the end of the elastic support part 133a. The fixed support part 133b extends substantially parallel to the hinge axis H. The fixed support part 133b is fixed to a groove provided in the seating portion 127, and the end of the fixed seating portion 133b may take a bent shape. The bent shape of the fixed support part 133b prevents the fixed support part 133b from being moved horizontally in relation to the inner surface of the cover 111 in the state where the fixed support part 133b is fixed to the seating portion 127.

It can be seen in FIG. 4 that the fixed support part 133b extends horizontally on the drawing, and its end extends vertically. As the fixed support part 133b with this shape is received in the groove with a corresponding shape (the groove formed in the seating portion 127), it is possible to prevent the fixed support part 133b from being moved in relation to the inner surface of the cover 111.

When the first free end 133 is disposed in the seating portion 127, the elastic part 131 is positioned on the round portion 121. When the auxiliary cover 113 is coupled in the state where the elastic part 131 is positioned on the round portion 121, the first free end 133 is fully received in the groove of the seating portion 127, and the elastic part 131 is aligned on a straight line with the first pivot hole 125. That is, when the auxiliary cover 113 is coupled after the elastic member 103 is disposed at a predetermined position, the first and second pivot holes 125 and 113b and the coiled elastic part 131 are aligned along the hinge axis H. Accordingly, it is not required to separately align the elastic member 103 or the like in coupling the cover 111 to the body 11, and the cover 111 can be coupled to the body 11 merely by aligning the cover 111 to the body 11.

Figure 5:
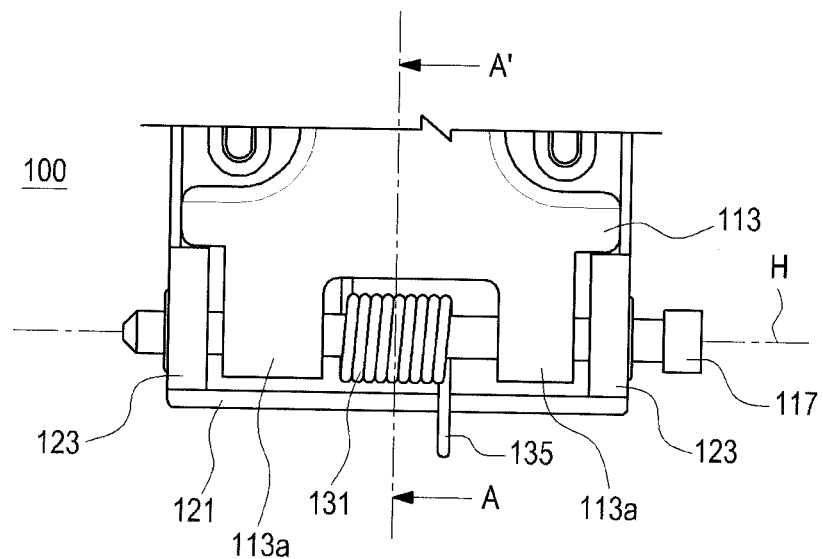
FIG. 5 is a top plan view illustrating the cover apparatus depicted in FIG. 3 according to an exemplary embodiment of the present invention.

FIG. 5 is a top plan view illustrating the cover apparatus depicted in FIG. 3 according to an exemplary embodiment of the present invention. FIG. 6 is a cross-sectional view illustrating the cover apparatus taken along line A-A' in FIG. 5 according to an exemplary embodiment of the present invention.

Referring to FIGS. 5 and 6, when the auxiliary cover 113 is coupled to the cover 111 in a state in which the elastic member 103 is disposed on the cover 111, the elastic member 131 is positioned between the support pieces 113a. In that event, because the fixed support part 133b is suppressed from being moved horizontally as described above, it can maintain the predetermined position. In addition, the fixed support part 133b is interposed between the cover 111 and the auxiliary cover 113 to be suppressed from being moved vertically in relation to the inner surface of the cover 111. Accordingly, the elastic member 103 can maintain a stable position on the cover 111.

In the state in which the elastic member 103 and the auxiliary cover 113 are coupled to the cover 111, the elastic member 103 will maintain a predetermined position on the cover 111. Accordingly, in the process of coupling the cover 111 to the body 11, it is easy to align the cover 111 to the assembling position of the body 11 while making the bent end of the second free end 135 in the bind hole 17.

In the state in which the cover 111 is aligned to the assembling position of the body 11, the cover 111 is pivotably bound to the body 11 by a pivot pin 117. The pivot pin 117 is fixed to the body 11 at its opposite ends, and is coupled to the support ribs 123 of the cover 111 by extending through the support ribs 123. The first pivot holes 125, which are formed in the support ribs 123, provide a passage through which the pivot pin 117 extends. Because the elastic member 103 and the auxiliary cover 113 are coupled to each other prior to coupling the pivot pin 117, the cover apparatus 100 is completed merely by aligning the cover 111 to the body 11, and binding the cover 111 with the pivot pin 117. In the process of inserting the pivot pin 117 through the support ribs 123, the elastic part 131 is also arranged between the support pieces 113a in the form of being wound around the outer periphery of the pivot pin 117. Also, the ends of the support pieces 113a are coupled in a form of surrounding the outer periphery of the pivot pin 117. Consequently, the pivot pin 117 practically provides a pivot center of the cover 111, and the cover 111 pivots on the body 11 while being supported by the support ribs 123, and the support pieces 113a of the auxiliary cover 113.

As described above, in the state where no external force is applied, the free ends 133 and 135 of the elastic member 103 are maintained in a state inclined at an angle of about 150 degrees. Accordingly, if no external force is applied, the cover 111 coupled to the body 11 is maintained in the state opened at an angle of about 150 degrees. However, the opened angle of the cover may be limited in a range of 110 to 130 degrees due to the interference between the cover 111 and the body 11. Assuming that the cover 111 may be opened by 130 degrees, the elastic member 103 will provide a driving force in the direction of further opening the cover 111 even in the state where the cover 111 is fully opened. Accordingly, the cover 111 can maintain the stably fixed state with the help of the elastic force of the elastic member 103 even when the cover 111 is pivoted to its permitted widest angle on the body 11.

Figure 7:
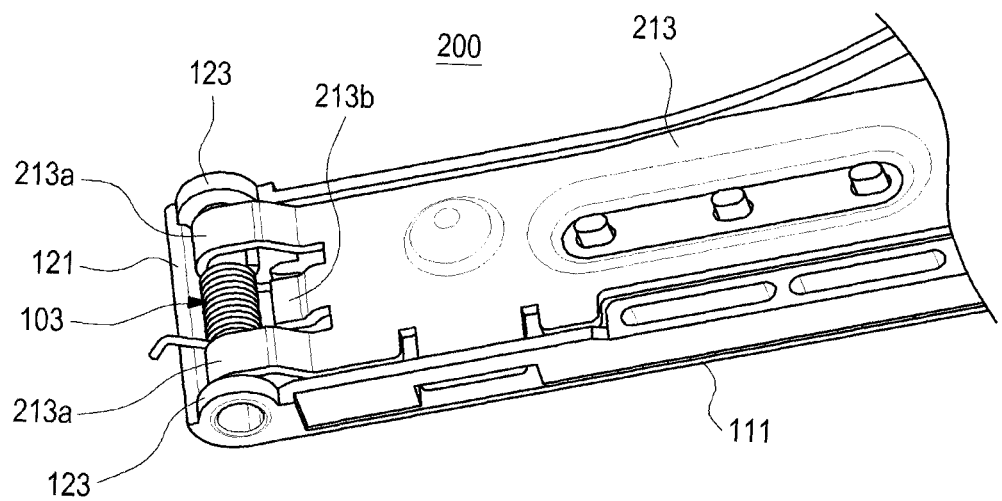
FIG. 7 is a perspective view illustrating a cover apparatus according to another exemplary embodiment of the present invention.
Figure 8:
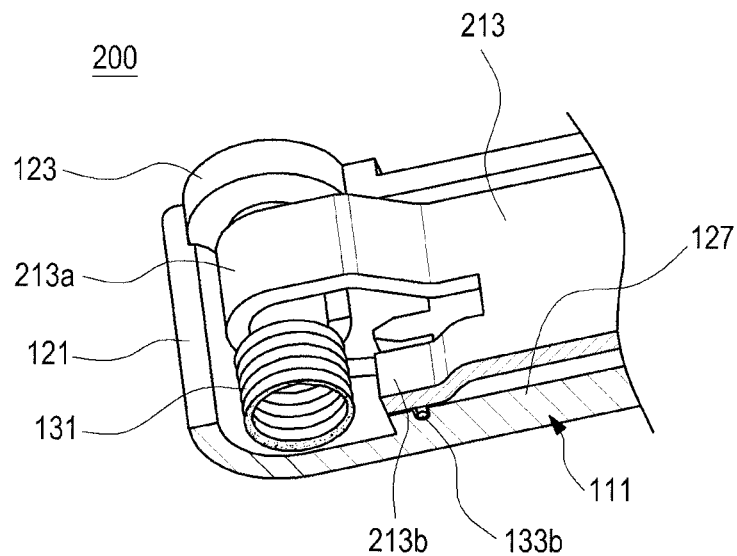
FIG. 8 illustrates the cover apparatus depicted in FIG. 7 in a partially cut-away view according to an exemplary embodiment of the present invention.
Figure 9:
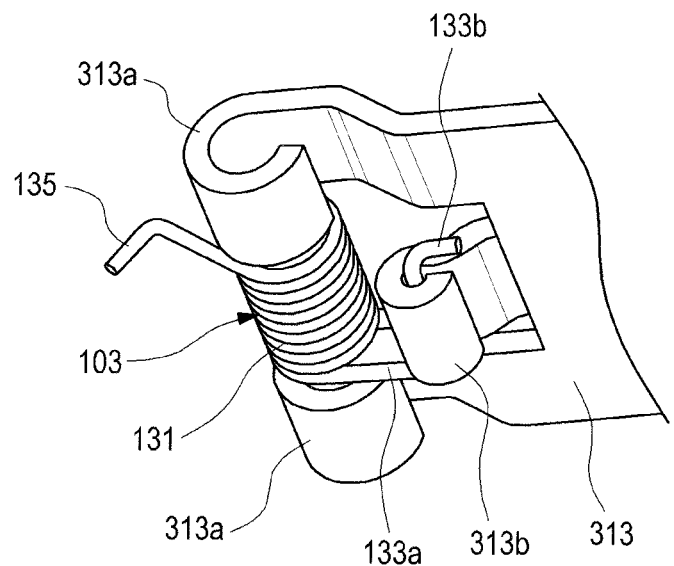
FIG. 9 is a view for describing a modification to the cover apparatus depicted in FIG. 7 according to an exemplary embodiment of the present invention.

FIGS. 7 and 8 illustrate a cover apparatus according to another exemplary embodiment of the present invention. FIG. 9 illustrates a modification to the cover apparatus depicted in FIG. 7 according to an exemplary embodiment of the present invention.

The cover apparatuses according to the exemplary embodiments illustrated in FIGS. 7 to 9 are different from the foregoing exemplary embodiment in terms of the constructions of the auxiliary covers 213 and 313, and substantially equal to the foregoing exemplary embodiment except the constructions of the auxiliary covers 213 and 313. Accordingly, it shall be noted that the elements that can be easily understood through the descriptions of the forgoing exemplary embodiments will be denoted by similar reference numerals or omitted, and the detailed description thereof may be omitted.

Referring to FIGS. 7 and 8, the auxiliary cover 213 of the cover apparatus 200 is fabricated by pressing a metallic sheet, and includes support pieces 213a formed at one end thereof, and fixing pieces 213b formed between the support pieces 213a. The ends of the support pieces 213a are processed in a shape surrounding the outer periphery of the pivot pin 117 to support the pivot of the cover 111 together with the support ribs 123 of the cover 111. The fixing pieces 213b extend from one end of the auxiliary cover 213, and in the state where the auxiliary cover 213 is coupled to the cover 111, the fixing pieces 213b are tightly contacted with the seating portion 127. Accordingly, the fixing pieces 213b prevent the end of the elastic member 103 fixed to the seating portion 127 from breaking away from the seating portion 127.

FIG. 9 exemplifies a construction capable of fixing an end of the elastic member 103 to the auxiliary cover 313. The auxiliary cover 313 is also fabricated by pressing a metallic sheet, and includes support pieces 313a formed at one end thereof, and a seating portion 313b formed between the support pieces 313a. The support pieces 313a are coupled to surround the outer periphery of the pivot pin 117, and support the pivot of the cover 111 together with the support ribs 123 of the cover 111. The seating portion 313b is provided to extend from the one end of the auxiliary cover 313 to surround an end of the elastic member 103. The first free end 133 of the elastic member 103 is bound and fixed to the seating portion 127 provided on the auxiliary cover 313. In that event, the elastic part 131 of the elastic member 103 is aligned on the hinge axis H together with the ends of the support pieces 313a between the support pieces 313a. Because the auxiliary cover 313 is configured to include the seating portion 313b to support an end of the elastic member 103, a separate seating portion is not formed on the cover to which the auxiliary cover 313 is coupled. However, a recess may be formed on the inner surface of the cover to which the auxiliary cover 313 is coupled to accommodate the seating portion 313b.

As described above, because the inventive cover apparatus for an electronic device enables an elastic member to be aligned at a predetermined position by a cover assembling construction of the electronic device itself, it is easy to assemble the cover to the body of the electronic device and it is possible to secure a consistent quality.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A cover apparatus for an electronic device and a body of the electronic device, the cover apparatus comprising:
    a cover configured to be pivotably coupled to the body of the electronic device to open or close a portion of the body;
    an auxiliary cover coupled to an inner surface of the cover, the auxiliary cover formed by pressing a metallic sheet; and
    an elastic member, one end of which is supported by the cover, and the other end of which is supported by the body,
    wherein the elastic member provides a driving force to pivot the cover in a direction for opening the portion of the body, and the cover comprises a seating portion, formed at an end thereof, to surround and to fix the one end of the elastic member.

2. The cover apparatus and body of claim 1, wherein the elastic member comprises:
    an elastic part wound in a coil shape around a hinge axis which is the pivot center of the cover; and
    free ends extending from opposite ends of the elastic part, respectively, wherein a first of the free ends is fixed to the seating portion.

3. The cover apparatus and body of claim 2, wherein the first of the free ends of the elastic member comprises:
    an elastic support part extending perpendicular to the hinge axis; and
    a fixed support part bent at and extending from an end of the elastic support part in parallel to the hinge axis, the fixed support part being fixed to the seating portion.

4. The cover apparatus and body of claim 1, wherein the cover further comprises support ribs formed at the opposite ends of a round portion to be opposed to each other, wherein the round portion is formed at one end of the cover, and the elastic member is disposed between the support ribs.

5. The cover apparatus and body of claim 4, further comprising:
    a pivot pin, opposite ends of which are fixed to the body and coupled through the support ribs, thereby providing a pivot center of the cover.

6. The cover apparatus and body of claim 5, further comprising:
    support pieces extending from an end of the auxiliary cover,
    wherein the support pieces are coupled to surround the outer periphery of the pivot pin thereby supporting the pivot of the cover, and the seating portion is formed between the support pieces.

7. The cover apparatus and body of claim 6, wherein a portion of the elastic member is wound on the outer periphery of the pivot pin between the support pieces.

8. The cover apparatus and body of claim 1, wherein the other end of the elastic member is supported by the body by a bind hole formed in the body.

* * * * *